(12) United States Patent
Hui

(10) Patent No.: US 6,310,490 B1
(45) Date of Patent: Oct. 30, 2001

(54) CMOS SMALL SIGNAL SWITCHABLE, IMPEDENCE AND VOLTAGE ADJUSTABLE TERMINATOR NETWORK AND RECEIVER INTEGRATION

(75) Inventor: David T. Hui, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/580,805

(22) Filed: May 30, 2000

(51) Int. Cl.[7] .................................................. H03K 19/003
(52) U.S. Cl. .................................................. 326/30; 326/26
(58) Field of Search .................................. 326/30, 26, 27, 326/31, 21

(56) References Cited

U.S. PATENT DOCUMENTS

| | | |
|---|---|---|
| 4,228,369 | 10/1980 | Anantha et al. . |
| 4,525,830 | 7/1985 | Cohen et al. ............................. 370/60 |
| 4,748,426 | 5/1988 | Stewart ................................ 333/22 R |
| 4,989,202 | 1/1991 | Soto et al. ............................... 370/13 |
| 5,204,860 | 4/1993 | Sparks ................................. 370/110.1 |
| 5,387,131 | 2/1995 | Foreman et al. ....................... 439/620 |
| 5,493,657 | 2/1996 | Van Brunt et al. .................... 395/308 |
| 5,523,704 | 6/1996 | So ............................................ 326/30 |
| 5,675,580 | 10/1997 | Lyon et al. ............................. 370/250 |
| 5,729,824 | 3/1998 | O'Neill et al. .......................... 455/3.1 |
| 5,781,028 | * 7/1998 | Decuir ...................................... 326/30 |
| 5,850,387 | 12/1998 | Lyon et al. ............................. 370/250 |
| 5,917,827 | 6/1999 | Cantwell ................................ 370/466 |
| 5,977,797 | 11/1999 | Gasparik ................................. 326/86 |

FOREIGN PATENT DOCUMENTS

404020120A * 1/1992 (JP) .

* cited by examiner

*Primary Examiner*—Michael Tokar
*Assistant Examiner*—James Cho
(74) *Attorney, Agent, or Firm*—Lynn L. Augspurger

(57) ABSTRACT

A terminator circuit for connection to a network can be fabricated and used within CMOS-SOI (complementary metal oxide semiconductor—silicon on insulator) for carrying small logic level signals for connecting data from a network's first circuit to a network's second circuit in which a network's input terminal connects a terminator circuit to the network's second circuit to act as a terminator on the data line passing data from said first circuit to said second circuit. The terminator circuit has a reference circuit coupled to a terminal circuit. An adjustment section provides an impedance adjustment and adjustment circuits for tuning the center voltage of the incoming voltage swing up and down. A differential receiver has a stable and well centered threshold voltage is coupled to the network input terminal for connecting the network's first circuit to the network's second circuit.

19 Claims, 6 Drawing Sheets

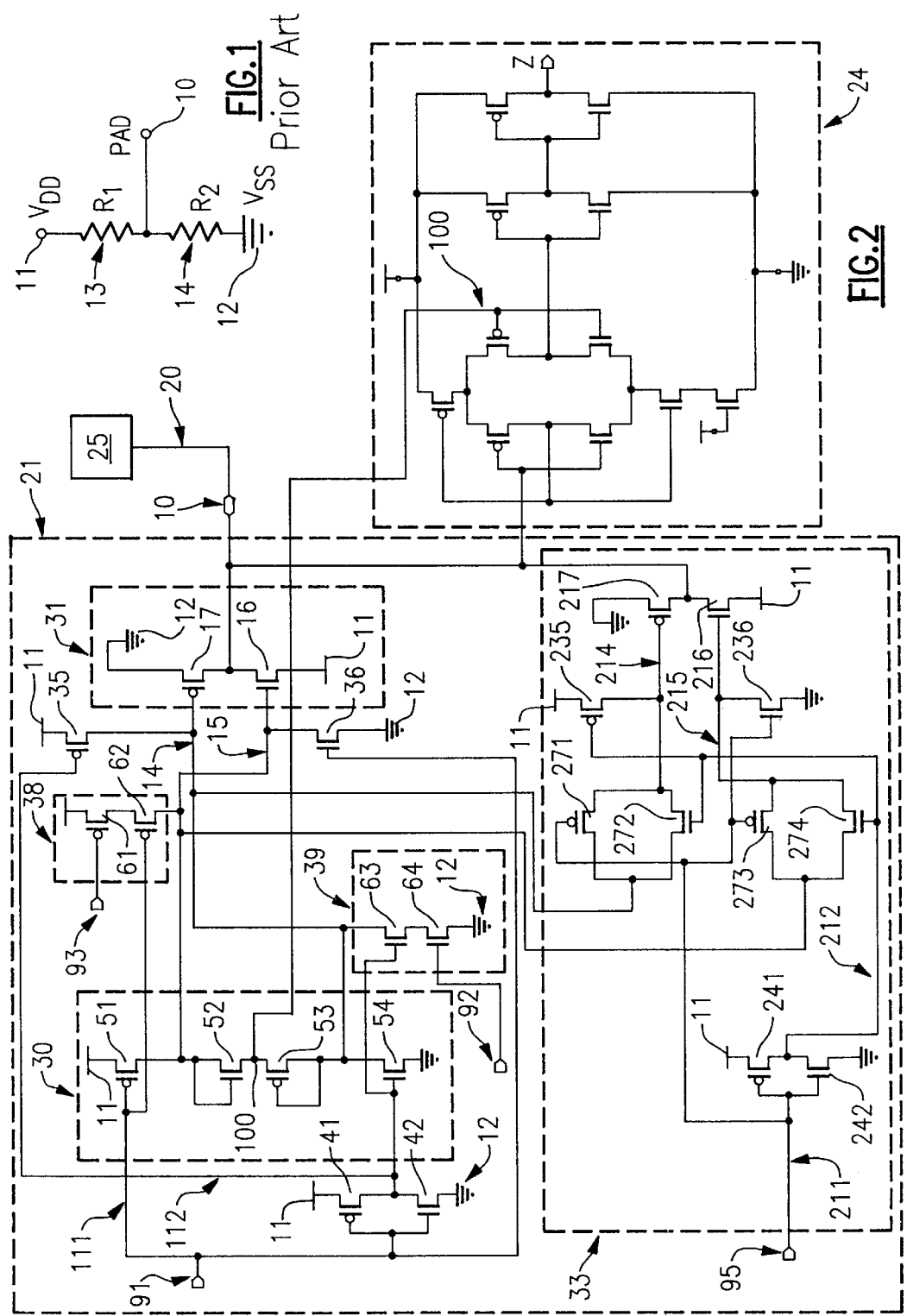

CM OS SMALL SIGNAL SWITCHABLE, IMPEDENCE AND VOLTAGE ADJUSTABLE TERMINATOR NETWORK AND RECEIVER INTEGRATION

RELATED APPLICATIONS

This application is related to the following concurrently filed application (s):

U.S. Ser. No. 09/580,290, filed May 30, 2000, entitled: CMOS Small Signal Terminator and Network, naming David T. Hui, inventor; and U.S. Ser. No. 09/583,187, filed May 30, 2000, entitled: SOI SMALL SIGNAL TERMINATOR AND NETWORK, naming David T. Hui, inventor; and U.S. Ser. No. 09/583,185, filed May 30, 2000, entitled: Method for use with a Terminator and Network, naming David T. Hui," inventor; and U.S. Ser. No. 09/580,802, filed May 30, 2000, entitled: CMOS Small Signal Terminated Hysteresis Receiver, naming David T. Hui, inventor; and U.S. Ser. No. 09/580,289, filed May 30, 2000, entitled: CMOS Small Signal Terminated Receiver, naming David T. Hui, inventor; and U.S. Ser. No. 09/583,055, filed May 30, 2000, entitled: CMOS Small Signal Switchable Terminator Network, naming David T. Hui, inventor, and U.S. Ser. No. 09/583,186, filed May 30, 2000, entitled: CMOS Small Signal Switchable Adjustable Impedance Terminator Network, naming David T. Hui, inventor; and U.S. Ser. No. 09/580,789, filed May 30, 2000, entitled: CMOS Small Signal Switchable and Adjustable Terminator Network, naming David T. Hui, inventor; and U.S. Ser. No. 09/583,188, filed May 30, 2000, entitled: CMOS Small Signal Switchable Impedance and Voltage Adjustable Terminator Network, naming David T. Hui, inventor; and U.S. Ser. No. 09/583,680, filed May 30, 2000, entitled: CMOS Small Signal Switchable Impedance and Voltage Adjustable Terminator with Hysteresis Receiver Network, naming David T. Hui, inventor; and U.S. Ser. No. 09/580,942, filed May 30, 2000, entitled: SOI Small Signal Terminated Hysteresis Receiver, naming David T. Hui, inventor; and U.S. Ser. No. 09/580,943, filed May 30, 2000, entitled: SOI Small Signal Terminated Receiver, naming David T. Hui, inventor.

FIELD OF THE INVENTION

This invention relates to terminators which are applicable to metal oxide semiconductor on insulator (MOS-soi) with triple wells integrated circuit technology and which are particularly useful for terminator networks.

This related application(s) and the present application are owned by one and the same assignee, International Business Machines Corporation of Armonk, N.Y.

The descriptions set forth in these co-pending applications are hereby incorporated into the present application by this reference.

Trademarks: S/390 and IBM are registered trademarks of International Business Machines Corporation, Armonk, N.Y., U.S.A. Other names may be registered trademarks or product names of International Business Machines Corporation or other companies.

BACKGROUND

For signal interfaces between devices terminators have been used, as described for instance in U.S. Pat. No. 4,748,426: entitled "Active termination circuit for computer interface use", granted May 31, 1988 to Alexander Stewart for Rodime PLC, in an active termination circuit for a computer interface for reducing line reflection of logic signals. Such terminators have used a first and second resistor combination to permanently connect to a signal line that couples a plurality of peripheral devices to one another. The other ends of the first and second resistors are connected through a switching device to a positive voltage supply line and to logic ground, respectively. When termination of multiple devices was required, a plurality of resistor combinations were provided but on/off control of the switch in this example was achieved by one control that is located remote from the termination circuit systems. Integrated circuit interconnection structures have also used precision terminating resistors, as illustrated by U.S. Pat. No. 4,228,369, granted in October, 1980 to Anantha et al. for IBM.

As will be illustrated for chip interconnection, when resistor terminators are used in thin film semiconductor integrated circuits such as those used in metal oxide semiconductors (e.g. CMOS) today, they create hot spots which cannot be adequately cooled, so such resistor terminator circuits which create hot spots cannot be used in metal oxide semiconductor applications to provide terminators for chip to chip connections on chips using IBM's new sub-micron MOS (CMOS) technologies where because of the high currents used in these networks it is difficult or impossible to meet all the cooling and reliability requirements required for commercial performance. It has become necessary to invent a solution to interfacing devices which can be used in such environments on chips, and used for terminators in networks of chips and devices where there is a need to transmit digital data therebetween without overshoot and undershoot in signal transmission between the chips and devices or systems. These connections need to operate at a faster speed, accommodating data rate speeds ranging into hundreds of Mhz and Ghz.

The creation of a terminator which particularly may be fabricated for high speed metal oxide semiconductor on insulator (MOS-soi) applications with triple wells in integrated circuits is needed.

It is therefore an object of the present invention to provide a terminator network adapted for MOS that can match the characteristic impedance of the line.

It is another object of the present invention to provide a terminator network which is fast and suitable for small signal swings and may also in a mixed technologies communication.

A further object of the present invention to provide a terminator network which has low current flow and low power consumption.

Still another objective of the present invention to provide a terminator network that provides ESD protection at the input of an attached circuit.

It is also an objective of the present invention to be able to switch into high impedance so that the driver can take control of the line and drive out for bi-directional data buses. Bi-directional data buses are used in all computer systems today.

It is still another objective of the present invention to be able to turnoff all currents to support the CMOS leakage test so that chips with defects can be found quickly and easily.

It is further an objective to be able to adjust the impedance of the terminator so that this circuit can have multiple usage.

It is another objective to be able to fine tune the terminator to have the desired reflection for the nets. This is to overcome any process tolerances.

It is also an objective of the present invention to be able to adjust the Vcenter voltage so that it can tune out any process mis-tracking of the pfet to nfets or mis-tracking of the power supplies from the sending to the receiving chip, and re-center the terminator voltage, so that maximum signal voltage can be obtain without creating skew between the zero and one logic levels.

A further object of the present invention to provide a terminator and receiver network which has low current flow and low power consumption.

It is also an objective to provide a receiver that can receive small signals properly. And have balanced noise tolerance between both logic levels.

Other objects and advantages of the invention will be apparent from the specification.

SUMMARY OF THE INVENTION

This invention provides a terminator and receiver network which is useful for fast transmission of digital data, eliminating or reducing overshoot and undershoot in signal transmission between chips and between systems, in serial links and data buses, for minimizing ringing and similar noise problems, for providing electrostatic discharge (ESD) protection, particularly in high speed metal oxide semiconductor (MOS) integrated circuit applications, and mixed vender technology interface communications. The demand for fast data transmission has pushed the data rate into hundreds of Mhz and Ghz and the preferred embodiment accommodates such speeds and reduces the signal swing so that the signal reach its desired digital ones or zeros voltage levels faster with lower power and with less noise generation.

The preferred embodiment of the invention control and adjustment of the impedance of the terminator so that it can operate the part in different packages as well as in system tuning for perfect termination. This will allow a part to have multiple usage's. This provides a basis for cost saving on chips with part number reduction and a high volume ASIC OEM useful circuit.

The preferred embodiment of the invention control and adjustment of the center voltage of the terminator so that maximum signal can be received and it does not create skew between the zero and one logic levels In case of mixed signal interfaces.

The receiver of the preferred embodiment provides good control on its threshold voltage to deal with small signals. It sets up a well balanced threshold voltage between the incoming logic levels, so that maximum noise tolerance between logic levels can be achieved for this receiver and the digital system.

These and other improvements are set forth in the following detailed description. For a better understanding of the invention with advantages and features, refer to the description and to the drawings.

DESCRIPTION OF THE DRAWINGS

FIG. 1 illustrates the piror art Resistor Terminator Network.

FIG. 2 illustrates the present invention CMOS small signal switchable, impedance and voltage adjustable terminator network and receiver integration.

Figure 3:
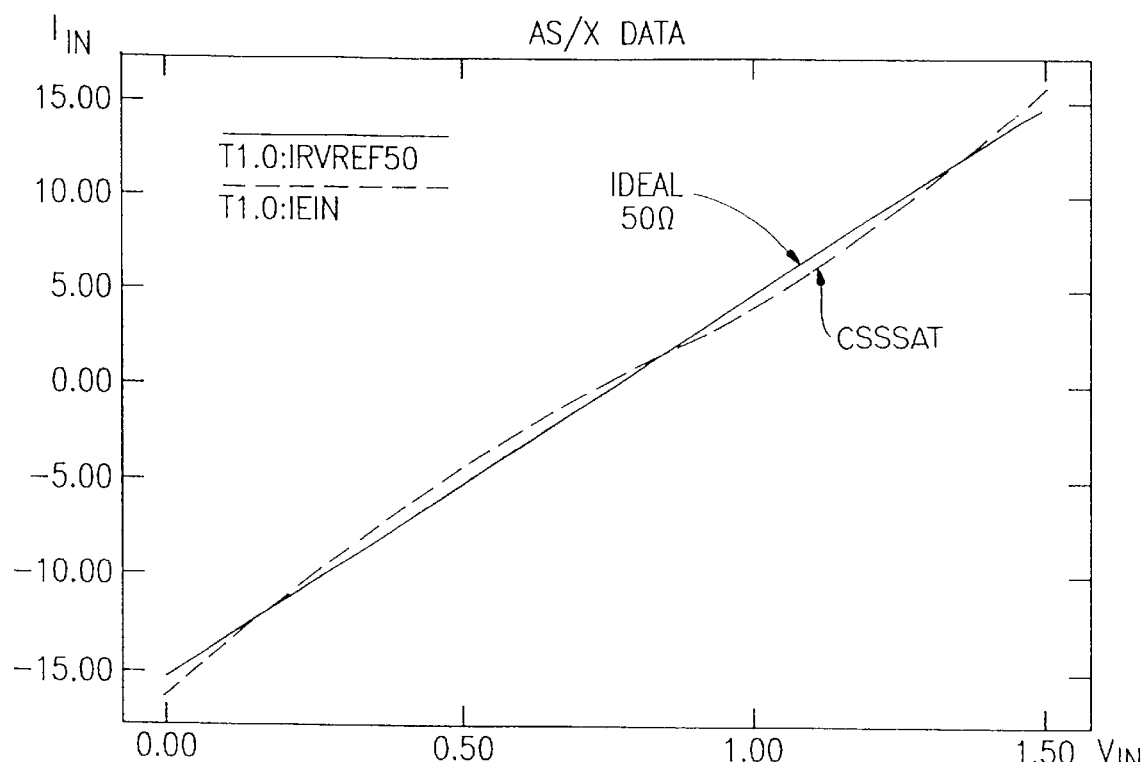
FIG. 3 is a graph having two curves depicting input currents as a function of the input voltages for the CMOS small signal terminator network constructed according to the present invention and a ideal 50 ohm terminator.

My detailed description explains the preferred embodiments of the invention, together with advantages and features, by way of example with reference to the drawings.

DETAILED DESCRIPTION OF THE INVENTION

Resistor terminators were used in prior art as shown in FIG. 1. Where resistor 13 is connected to node 11 to the upper power supply VDD and the other end of resistor 13 is connected to the node 10 and is also connected in series to resistor 14, The other end of resistor 14 is then connected to node 12 to the lower power supply VSS. The value of the resistors are set so that node 10 has a bias voltage equal to the center of the in coming signal swing and the parallel combination of the resistors matches the characteristic impedance ZO of the transmission line that it is connected to, so that no reflections will occur and a clean signal can be obtain. However, these resistor terminators are prohibited to be used because of the significant power that is dissipated in them. It is also made difficult in the construction of these resistor terminator on chips using the new sub-micron MOS technologies because of the high currents in this network making it impossible to meet all the cooling and reliability requirements.

In describing the preferred embodiment of the present invention, I have provided a CMOS terminator circuit for CMOS small signal switchable and adjustable terminator networks which uses a reference voltage and the present preferred embodiment allows adjustment of the Vcenter reference voltage so that it can tune out any process mis-tracking of the control devices in the terminator input circuit and enables the reference terminator voltage to be re-centered, and with respect to this CMOS terminator circuit reference will be made herein to FIG. 2 to FIG. 7 of the drawings.

FIG. 2 shows a network 20 carrying signals from a first circuit 25 to a second circuit 24. An input terminal 10 connects the terminator circuit 21 to the input-output circuit 24. The first circuit 25 may be operating at a different voltages then the second circuit 24. Generally, the terminating circuit 21 and the second circuit 24 will be constructed very close together physically in the same electronic system whereas the first circuit 25 communicating over net 20 may be remotely located in the same electronic system or even external to the electronic system in which the terminating circuit and the second circuit 24 are located. It is preferred that the electronic systems in which the circuits 21, 25 and 24 are located are digital systems such as computer systems, and the network 20 may be connecting different components such as different processor or memory buses or data links or may be connecting different electronic components between two computer systems or other electronic systems which need to communicate data, digitized electrical signals or electrical signals.

In the terminator circuit 21 illustrated in FIG. 2 is comprised of a main reference circuit 30, an input circuit 31, an adjustment section with adjustment circuits 38 and 39 and disable controls.

The main reference circuit 30 generates two reference voltages on node 14 and node 15. These two voltages can be produce independently on separate paths or a single path with series connected devices as shown in FIG. 2 as a prefer embodiment. This main reference path is comprised of a series connected devices. The source of pfet 51 is connected to the upper power supply 11 and its drain connected to node 15, and from node 15 it is connected to the gate and drain of nfet 52. The source of nfet 52 is connected to node 100, node 100 is then connected to the source of pfet 53, the gate of pfet 53 is tied to its drain and both are connected to node 14, and from node 14 connected to the drain of nfet 54. The source of nfet 54 is connected to the lower power supply 12 or ground. The gate of pfet 51 is connected to node 111 which is also connected to the gate of nfet 36 and to the Terminator Inhibit Control on-chip input signal lead 91, which is also connected to the input of an inverter that is made up of pfet 41 and nfet 42, the output of the inverter is connected to node 112 and is connected to the gate of nfet 54 and the gate of pfet 35. The source of pfet 35 is connected to node 11 or Vdd, and the drain is connected to node 14. The source of nfet 36 is connected to node 12 or gnd and its drain connected to node 15.

There is also a first adjustment circuit 38 to node 15. It is made up of pfet 61 with the source to node 11 (vdd) and drain to source of pfet 62 and its drain to node 15. The gate of pfet 61 connects to the terminal 93, The gate of pfet 62 is connected to terminal 91 by node 111.

The second adjustment circuit 39 connects to node 14. It is made up of series source drain connected nfet 63 and 64, The source of nfet 64 is connected to node 12 (ground). The drain of nfet 64 is then connected to source of nfet 63. The drain of nfet 63 is connected to node 14.

Node 15 is also connected to the gate of nfet 16 in the input circuit 31. Node 14 is connected to the input circuit 31 at gate of pfet 17. The sources of nfet 16 and pfet 17 are tied together to the input terminal 10 or PAD, then is connected to net 20, and then to the driving circuit 25 as stated in the beginning.

FIG. 2 shows another part of the adjustment section that is used to adjust the impedance of the terminator. It is made up of adjustment section circuit 33 and control terminal 95, which is connected to node 211. Node 211 is then connected to the gate inputs of a inverter pfet 241 and nfet 242. The output of this inverter which is the drains of pfet 241 and nfet 242 is connected to node 212. These drain signals or output of the inverter are the control signals for the impedance adjustment circuit 33. Node 14 carries the upper reference voltage to the transmission gates pfet 271 and nfet 272 inside adjustment section circuit 33, with their gates connected to node 211 and node 212 respectively. The output of the transmission gates are connected to node 214 and gate of input pfet 217 and the drain of pfet 235, the source of 235 is connected to node 11 or Vdd. The gate of pfet 235 is connected to node 212 which is also connected to the gates of nfet 272 and nfet 274 in the two transmission gates. Node 15 carries the lower reference voltage to the transmission gates pfet 273 and nfet 274 inside circuit 33, with their gates connected to node 211 and node 212 respectively. The output of the transmission gates are connected to node 215 and gate of input nfet 216 and the drain of nfet 236, the source of 235 is connected to node 12 or GND. The gate of nfet 236 is connected to node 211 which is also connected to the gates of nfet 271 and pfet 273 in the two transmission gates. The sources of pfet 217 and nfet 216 are connected together and also connected to the input terminal 10.

The operation of this invention is as follows. This terminator network can be disabled with control signal 91 equal to a logic level "1", and enabled with a logic "0". When input terminal 91 is at "1", node 111 is at VDD voltage. Node 111 connects to an inverter pfet 41 and nfet 42 producing a inverted signal in node 112 which is at ground. The pfet 51, 62 and nfet 54, 64 are not conducting because of their gate voltages, nfet 36 conducts and pulls node 15 to gnd, pfet 35 conducts and pulls node 14 to vdd. This also turn off pfet 17 and nfet 16 respectively. The terminator network is now "OFF" in an non-conduction mode. If it is in a bi-directional bus situation the local driver can then be turned on to send out the data for example or for leakage testing.

When the control signal 91, 92 is '0' and 93 is set to "1", The main reference path is turn-on, pfet 51 and nfet 54 turns on and pfet 35 and nfet 36 are now 'off'. The feature of invention that node 100 is tuned to a voltage level equal to the center of the in coming voltage swing between the logic '1' and '0' voltage levels is used in control and adjustment. From herein this center voltage will be call Vcenter. This Vcenter is then connected to one input of the differential receiver circuit 24, so that the differential receiver in circuit 24 will now have a stable and well centered threshold voltage. The other input of the differential receiver will be connected to the input terminal or PAD.

The receiver circuit 24 can be any differential receiver that is tuned to operate with the common mode voltage equal to Vcenter and have the speed requirements for the transmission system. Circuit 24 is an example of such operative differential receiver. This Vcenter will also set node 15 at a voltage which is a vt above the Vcenter and node 14 at a voltage which is a vt below Vcenter. When the terminal 10 is driven to rise above the Vcenter, the gate to source voltage in pfet 17 is driven to below vt, and more, and it starts to turn on and conduct current to 12 or ground, whereas when gate to source of nfet 16 is below vt and therefore has no conduction, and no current will flow in nfet 16 to 11 or VDD. On the other hand, when terminal 10 fall below Vcenter, the gate to source voltage of nfet 16 is above vt and turns 'on' to conduct current to 11 or the top upper power supply VDD. Now the pfet 17 is off since the gate to source voltage is above vt.

The preferred embodiment has the back to back gate to drain connected configuration of nfet 52 and pfet 53 in the reference circuit, and this tracks to its corresponding mirror like nfet 16 and pfet 17, and therefore this controls each of their turn on voltages and so no excessive through current in nfet 16 and pfet 17 will occur, and since at its logic states one of the input devices 16 or 17 will be off, this achieves low power.

When the application requires this terminator to operate at a lower Vcenter voltage because of any needed reason, it may be a lowered power supply and lower interface signals or process mis-tracking. The control signal to input terminal 92 can be set to "1". This will turn 'on' the adjustment path in circuit 39. the size of nfet 63 and 64 are preset so that Vcenter is down to the desired lowered Vcenter. On the other hand, if a higher Vcenter is needed, the control signal to input terminal 93 will be set to "0". This will turn-on the upper pfet adjustment path in circuit 38. Pfet 61 and 62 are sized to pull up the Vcenter to the upper desired Vcenter to match the higher input voltage swing in terminal 10.

When terminal 95 is at "1", node 211 is high and node 212 is low. This turns off all the transmission gates and turn on pfet 235 and nfet 236 which pull node 214 to node 11 (Vdd) and node 215 to node 12 (Gnd). This will set circuit 33 to high impedance and isolate it from the rest of the circuit.

When 95 is "0", then node 211 is low and node 212 is high. This turns off the disable devices pfet 235 and nfet 236. This will turn on circuit 33 and pass the reference voltages in nodes 14 and 15, and send them to the gate of the input active devices pfet 217 and 216 respectively. Pfet 217 mirrors pfet 17, and nfet 216 mirrors nfet 16. Therefore if pfet 17 or nfet 16 turns on, pfet 217 and nfet 216 will follow and turn on in a parallel path, This will reduce the terminator impedance. The present FIG. 2 shows 1 circuit 33 for the impedance adjustment for illustration, more adjustment circuits of circuit 33 and it's controls can be place in parallel if desired for more level of impedance adjustments.

The results of the small signal terminator network as constructed according to the present invention are shown in the following figures. The center of the input voltage swing is at vdd/2 for this illustration. Other input voltage swing can be design as well by changing the device size of pfet 51 and nfet 54 in the reference circuit.

FIG. 3 is a graph having two curves depicting input currents as a function of the input voltages for the CMOS small signal terminator network constructed according to the present invention and a ideal 50 ohm split resistor terminator. As shown the impedance of the present invention can be match very closely to the ideal resistor terminator.

Figure 4:
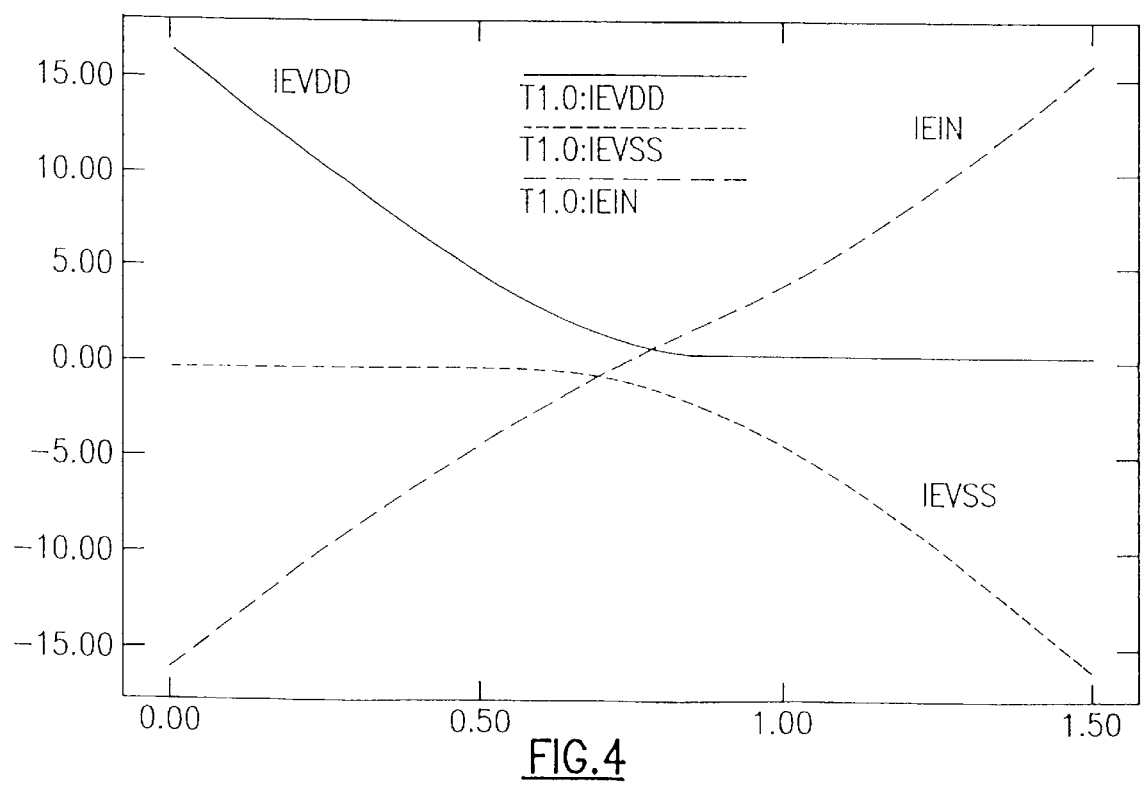
FIG. 4 is a graph having curves depicting the input current as a function of the input voltages for the CMOS small signal terminator constructed according to the present invention and curves of the upper and lower power supply currents as a function of the input voltage.

FIG. 4 is a graph having curves depicting the input current as a function of the input voltages for the CMOS small signal terminator constructed according to the present invention and curves of the upper and lower power supply currents as a function of the input voltage. The input current at the upper half cycle of the input voltage is directed to flow into the lower power supply, and current of the lower half cycle are directed to flow out from the upper power supply. Other then the bias current, there are no through current from the upper to the lower power supplies.

Figure 5:
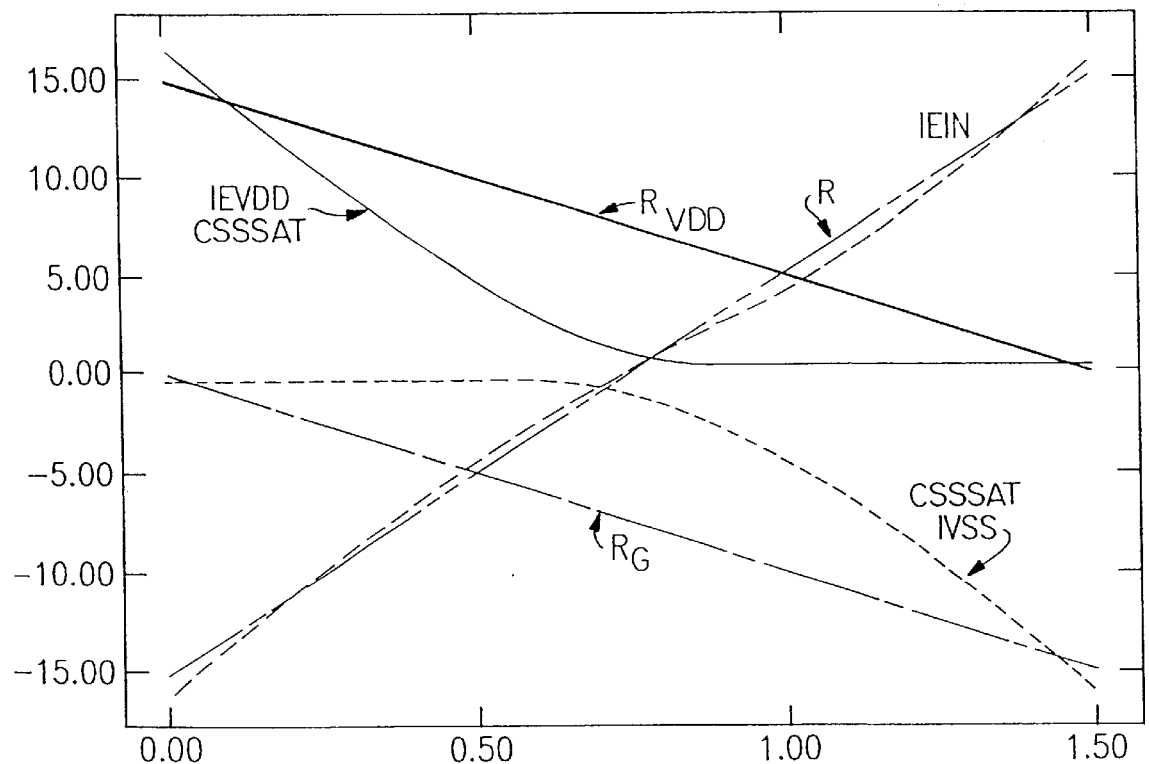
FIG. 5 is a graph having curves depicting the input current as a function of the input voltages for the CMOS small signal terminator constructed according to the present invention and curves of its currents to the upper and lower power supplies as a function of the input voltages. Also having curves of the corresponding input current, and the currents to the upper and lower power supplies for an split resistor terminator as in the piror art.

FIG. 5 is a graph having curves depicting the input current as a function of the input voltages for the CMOS small signal terminator constructed according to the present invention and curves of its currents to the upper and lower power supplies as a function of the input voltages. Also having curves of the corresponding input current, and the currents to the upper and lower power supplies for an split resistor terminator as in the piror art. This shows the large difference in the power supply currents at and near the center of the swing between the piror art and the present invention.

Figure 6:
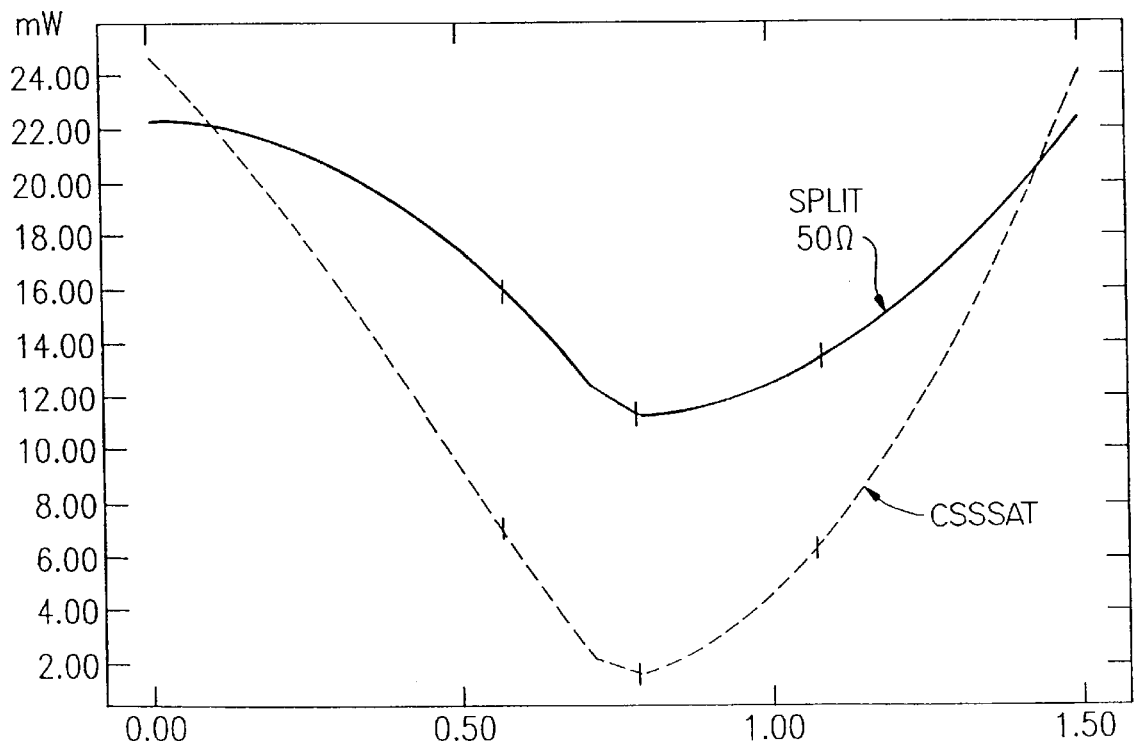
FIG. 6 is a graph having curves of the power consumption as a function of input voltages for the CMOS small signal terminator constructed according to the present invention and the power consumption of a split resistor as in piror art.

FIG. 6 is a graph having curves of the power consumption as a function of input voltages for the CMOS small signal terminator constructed according to the present invention and the power consumption of a split resistor as in piror art. This shows the power which the piror art consumes is a lot more then the present invention in small signal applications.

Figure 7:
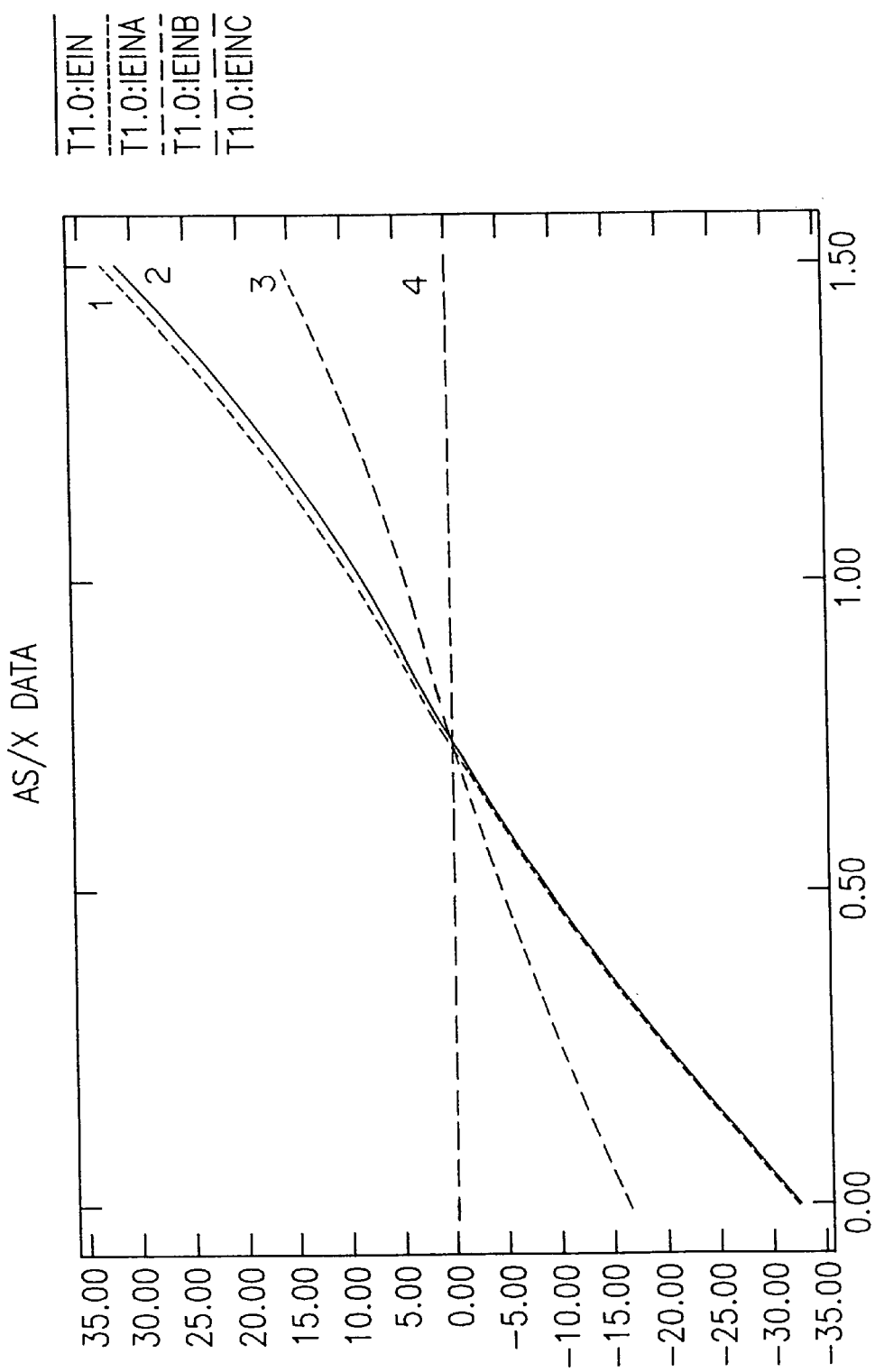
FIG. 7 is a graph with four curves showing the input current as a function of input voltages for four different terminator controls for the CMOS small signal terminated receiver constructed according to the present invention.

FIG. 7 is a graph with 4 curves showing the input currents as a function of input voltages for the CMOS small signal terminated receiver constructed according to the present invention with different control signals.

Curve 1 depicts the input current of the terminator with the Vcenter shifted down and at low impedance by setting terminal 92 and 93 to "1". Terminal 91 and 95 were set to "0".

Curve 2 depicts the input current of the terminator with the Vcenter not shifted and at low impedance by setting terminal 93 to "1". Terminal 91, 92 and 95 were set to "0".

Curve 3 depicts the input current of the terminator with the Vcenter not shifted and at normal impedance by setting terminal 93 and 95 to "1". Terminal 91 and 92 were set to "0".

Curve 4 depicts the input current of the terminator when it is set to high impedance or "OFF" by setting Terminal 91 "1".

Figure 8:
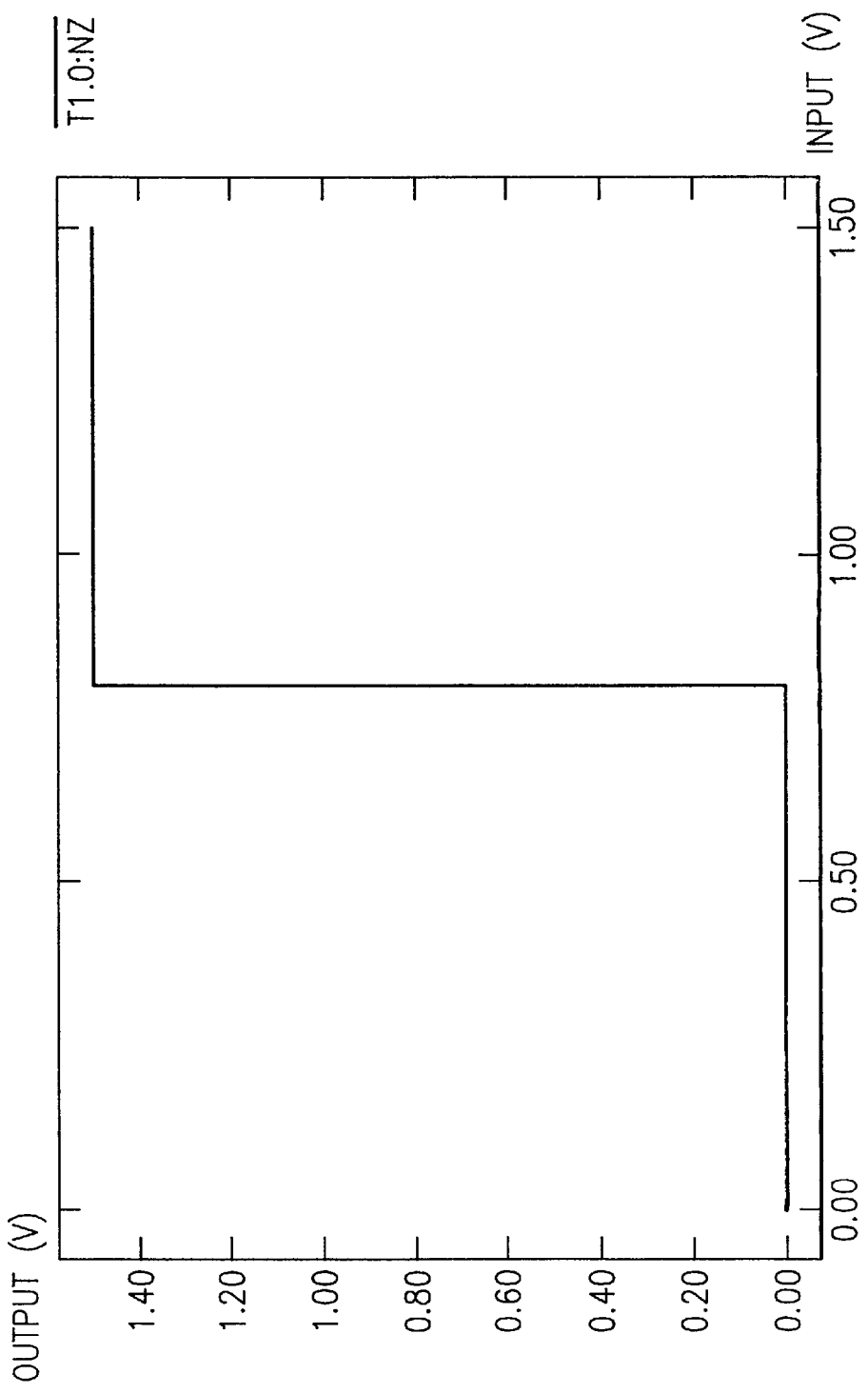
FIG. 8 is a graph with a curves showing the receiver output voltage as a function of input voltages for the CMOS small signal terminated receiver constructed according to the present invention.

FIG. 8 is a graph with a curve showing the receiver output voltage as a function of input voltages for the CMOS small signal terminated receiver constructed according to the present invention.

In terms of ESD protection, when the circuit described in the present invention is powered up, it has a low resistance path to one of the power supplies depending on the input voltage level. If the input terminal voltage move more then about 0.7 volts outside the upper or lower power supplies, the parasitic diodes and the parasitic bipolar transistor in the pfet 17 and nfet 16 also turn on to further reduce the input impedance Hanse improving the performance of the ESD protection. This performance is so effective that an additional ESD protection device may not be necessary to protect this circuit or the input/output circuit connected to this terminal there after. The parasitic elements in pfet 17 and nfet 16 are active even when the devices are not powered which provides significant ESD protection during handing of the device. The implementation shown result in a clean signal on network 20 with no or minimum reflection and noise generated in the system and a fast, solid, clean and reliable small swing can be obtain for a point to point nets as well as a cleaner multiple drop net. This implementation provide the fastest transmission of data and signals with much lower power consumption as compared to split resistive termination networks. This invention can adjust its terminating voltage up or down to best match the incoming signals. This feature makes it useful for mixed power supplies application and allow for process mis-tracking that may have moved the Vcenter voltage. This implementation shown has an adjustment circuit for Vcenter to go up and one adjustment circuit to adjust Vcenter to go down. But in fact more of these adjustment circuits can be place in pararel to make more adjustment points. Further more, it also generates the center voltage between logic "1" and "0" which is then feed into one of the Differential receiver inputs so that the receiver threshold voltage is always correct and tracks with the terminator.

This invention provided circuit that is able to control and adjust the impedance of the terminator so that it can operate the part in different packages as well as in system tuning for perfect termination. This will allow a part to have multiple usage. This can be a much needed cost saving chips part number reduction or a high volume ASIC OEM useful circuit.

This also provided a way to disable the termination function allowing in case of bi-directional buses to turn around and send data freely without this near end termination which can limit the signal swing and increased power. It also can support the CMOS leakage test by this disable function which is a key low cost test to eliminate process defects.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A CMOS terminator circuit for connection to a network carrying small logic level signals from a network's first circuit to a network's second circuit in which a network's input terminal connects a terminator circuit to the network's second circuit to act as a terminator on the data line passing data from said network's first circuit to said network's second circuit, comprising:

the terminator circuit (21) including a terminator reference circuit (30) generating logic '1' and logic '0' reference voltage levels and being coupled to a terminator input circuit (31) in said terminator circuit having a first and a second control device, and wherein said terminator circuit has an adjustment section for adjusting the impedance and voltage of the terminator circuit and is switchable from a first state to a second state by a switching control signal (91) supplied to said reference circuit and to said input circuit (31), said terminator input circuit being coupled to said network's input terminal (10) for connecting the network's first circuit to the network's second circuit, said reference circuit being tuned to a voltage level equal to the center of an adjustable incoming voltage swing between said logic '1' and '0' voltage levels of said reference circuit and coupled to one input of said differential receiver circuit (24) to provide to said differential receiver circuit a stable and well centered threshold voltage, said differential receiver having another differential receiver input which is coupled to the network input terminal for connecting the network's first circuit to the network's second circuit.

2. The CMOS terminator circuit according to claim 1 wherein when the network's input terminal (10) is driven to rise above the center of said tuned reference voltage, the gate to source voltage in an input circuit (31) first control device (pfet 17) is driven to a lower voltage, and said input circuit first control device starts to turn-on and conduct current to a lower level power supply (12 or ground), whereas when a second control device has no conduction, no current will flow to an upper level power supply, but when said network's input terminal (10) falls below center of said tuned reference voltage said second control device turns on to conduct current to said upper level power supply, while said first control device is off.

3. The CMOS terminator circuit according to claim 2 wherein said reference circuit tracks said first and second control devices of said input circuit, and controls each of their turn on voltages and so no excessive through current will occur.

4. The CMOS terminator circuit according to claim 3 wherein said reference circuit which tracks said first and second control devices of said input circuit also generates said center of said tuned reference between logic "1" and "0" which is then feed into one of the differential receiver inputs so that the receiver threshold voltage is always correct and tracks with the terminator input circuit for a small signal input operation to set up a threshold tuned reference voltage between the logic levels of said terminator input circuit for said network.

5. The CMOS terminator circuit for connection to a network according to claim 4, wherein said tuned reference voltage is tuned to a voltage level equal to the center of an incoming voltage swing between the logic '1' and '0' voltage levels between the upper level power supply and the lower level power supply, and the tuned reference voltage levels are set by said terminator reference circuit and mirrored into said differential receiver.

6. The CMOS terminator circuit for connection to a network according to claim 5 wherein said two reference voltages are supplied by a single reference path of said reference circuit which comprises the upper level power supply (11) which is coupled to a second node (15), and from said second node (15) said single reference path is connected to the gate and drain of a reference circuit nfet (52) device, and the source of said reference circuit nfet (52) device is connected to a tuned reference voltage node for said center of the reference voltage which is then connected to the source of a reference circuit pfet (53) device, and wherein the gate of the reference circuit pfet (53) device is tied to its drain and both the source and gate of the reference circuit pfet (53) device are connected to a first node (14) which is connected to the lower level power supply (12).

7. The CMOS terminator circuit for connection to a network according to claim 5 wherein said two reference voltages are supplied by a single reference path of said reference circuit which comprises a series connected first resistor (51) receiving power from the upper level power supply (11) which is coupled to a second node (15), and from second node (15) said voltage reference path is connected to the gate and drain of a reference circuit nfet (52) device, and the source of said reference circuit nfet (52) device is connected to a tuned reference voltage node which is then connected to the source of a reference circuit pfet (53) device, and wherein the gate of the reference circuit pfet (53) device is tied to its drain and both the source and gate of the reference circuit pfet (53) device are connected to a first node (14), and the first node (14) is connected to a second resistor (54) and the other end of said second resistor (54) is connected to the lower level power supply (12).

8. The terminator circuit for connection to a network according to claim 5 wherein said reference circuit has a reference circuit nfet and reference circuit pfet connect back to back gate to drain to track corresponding mirror devices of said terminator input devices to control each of their turn on voltages, so that no excessive through current in nfet (16) and pfet (17) will occur, and wherein, at this logic state, one of the mirror devices will be off and reduce the power requirements of the terminator network.

9. The terminator circuit according to claim 1 where a network input terminal is coupled to an adjustment section (33) for adjusting the terminating voltage up or down to adjust for the incoming signals supplied to said terminator circuit which is coupled to the network's input terminal for connecting the network's first circuit to the network's second circuit and said adjustment section (33) is able to be used for adjusting the impedance of the terminator.

10. The CMOS terminator circuit according to claim 9 wherein said adjustment section (33) includes a plurality of adjustment circuits for tuning the center voltage of the incoming voltage swing up and down.

11. The CMOS terminator circuit according to claim 10 wherein said adjustment section (33) includes an adjustment circuit for tuning the center voltage of the incoming voltage swing up and a second adjustment circuit to adjust center voltage of the incoming voltage swing down.

12. The CMOS terminator circuit according to claim 9 wherein said adjustment section (33) tunes the center voltage of the incoming voltage swing up and down to adjust for mis-tracking that may have moved the center voltage.

13. The CMOS terminator circuit according to claim 9 wherein when the network's input terminal (10) is driven to rise above the center of said tuned reference voltage, the gate to source voltage in an input circuit (31) first control device (pfet 17) is driven to a lower voltage, and said input circuit first control device starts to turn-on and conduct current to a lower level power supply (12 or ground), whereas when a second control device has no conduction, no current will flow to a upper level power supply , but when network's input terminal (10) falls below center of said tuned reference voltage said second control device turns on to conduct current to said upper level power supply, while said first control device is off.

14. The CMOS terminator circuit according to claim 13 wherein said reference circuit tracks said first and second control devices of said input circuit, and controls each of their turn on voltages.

15. The CMOS terminator circuit according to claim 9 wherein said terminator circuit can be disabled with a switching control signal (91) and when the terminator circuit is "OFF" in an non-conduction mode a driver can then be turned on to send out the data.

16. The CMOS terminator circuit according to claim 9 wherein said terminator circuit includes a terminator inhibit control input circuit coupled to said reference circuit and said input circuit's having a first and a second control devices to enable and disable said terminator network with said switching control signal (91).

17. The CMOS terminator circuit according to claim 9 wherein said terminator circuit can be disabled with said switching control signal (91) and when the terminator circuit is "OFF" in an non-conduction mode the driver can then be turned on to send out the data.

18. The CMOS terminator circuit according to claim 9 wherein said adjustment section has an adjustment circuit 33 and a control terminal (95) to provide control signals for the impedance adjustment circuit (33), and a reference circuit first node (14) carries an upper reference voltage for said control terminal (95) and a first node of said reference circuit a lower reference voltage for said control terminal and when said control terminal (95) is at "1" this turns off the impedance adjustment circuit, while when said control terminal (95) is at a "0" this turns on impedance adjustment circuit and causes the reference voltages in said first and second nodes to pass to said input circuit.

19. The CMOS terminator circuit according to claim 18 wherein multiple adjustment section impedance adjustment circuits are provided for multiple levels of impedance adjustment.

* * * * *